United States Patent [19]

Lu

[11] Patent Number: 5,362,665
[45] Date of Patent: Nov. 8, 1994

[54] METHOD OF MAKING VERTICAL DRAM CROSS POINT MEMORY CELL

[75] Inventor: Chih-Yuan Lu, Hsin-chu, Taiwan, Prov. of China

[73] Assignee: Industrial Technology Research Institute, Hsinchu, Taiwan, Prov. of China

[21] Appl. No.: 194,736

[22] Filed: Feb. 14, 1994

[51] Int. Cl.$^5$ ............................................. H01L 21/70
[52] U.S. Cl. ........................................ 437/52; 437/26; 437/47; 437/48; 437/60; 437/203; 437/919
[58] Field of Search ................... 437/47, 48, 52, 60, 437/919, 203, 26; 257/302, 303

[56] References Cited

U.S. PATENT DOCUMENTS

| | | | |
|---|---|---|---|
| 4,689,871 | 9/1987 | Malhi | 437/203 |
| 4,829,017 | 5/1989 | Malhi | 437/203 |
| 4,891,327 | 1/1990 | Okumura | 437/52 |
| 5,192,704 | 3/1993 | McDavid et al. | 437/919 |
| 5,244,824 | 9/1993 | Siuam | 437/52 |
| 5,270,239 | 12/1993 | Min et al. | 437/919 |

FOREIGN PATENT DOCUMENTS 140172 6/1986 Japan.
0028950 1/1989 Japan.

*Primary Examiner*—Tom Thomas
*Attorney, Agent, or Firm*—George O. Saile

[57] ABSTRACT

A pattern of field oxide isolation in a silicon substrate is provided wherein there are a pattern of openings to the silicon substrate. A pattern is formed of buried bit lines and a pattern of lines of holes with a hole located within each of the openings to said silicon substrate which lines of holes and buried bit lines are perpendicular to one another and which the lines cross at the planned locations of the vertical DRAM cell at the pattern of openings to the silicon substrate. A gate dielectric is formed on the surfaces of the holes. A doped polysilicon layer is formed in and over the holes. The doped polysilicon layer is etched to form the gate electrode and word lines which are perpendicular to the pattern of buried bit lines. The source/drain elements are formed surrounding the gate electrode in the surface of the substrate by ion implantation using the field oxide and gate electrode and word lines as the mask. The buried bit lines form common and additional source/drain elements. An insulating layer is provided over the pattern of field oxide insulation, word lines and openings to the source/drain elements surrounding the gate electrode. An opening is formed through the insulating layer surrounding the gate electrode. A capacitor is formed in and over the opening through the insulating layer.

23 Claims, 10 Drawing Sheets

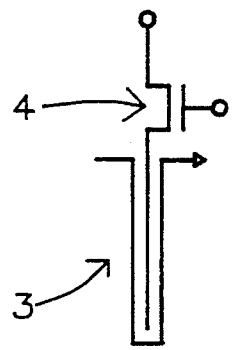
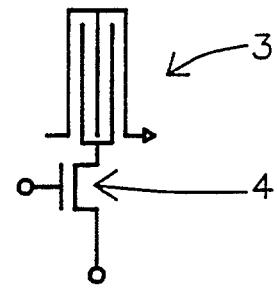
FIG. 1 - Prior Art    FIG. 2
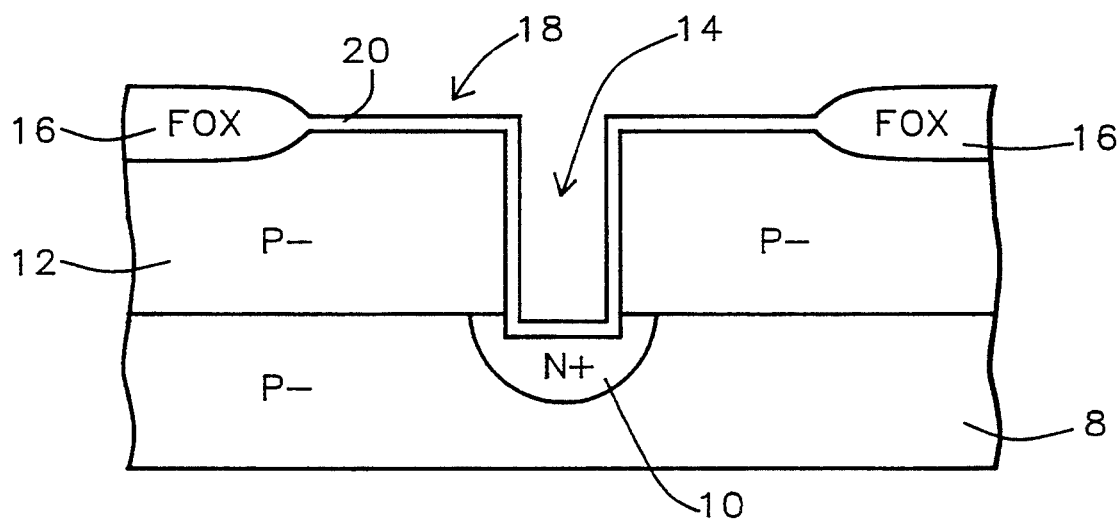
FIG. 3A
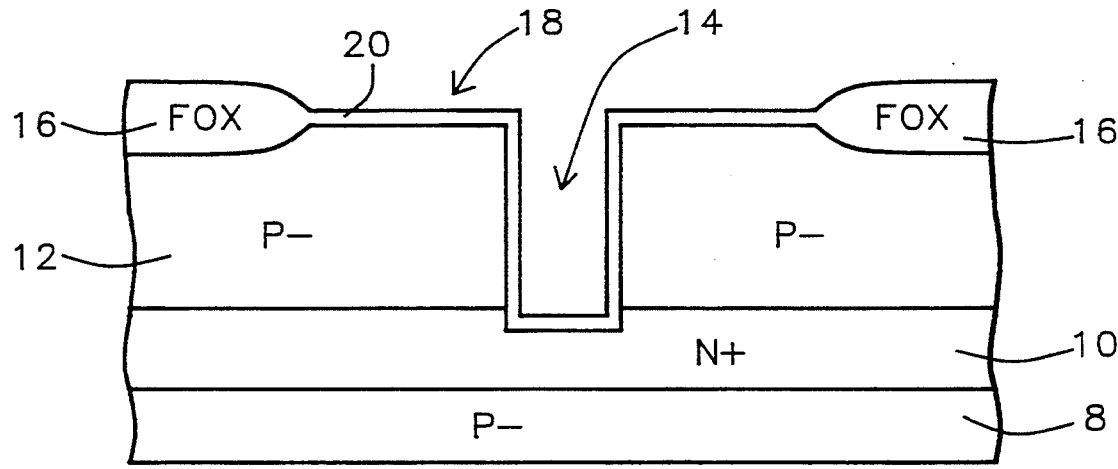
FIG. 3B

METHOD OF MAKING VERTICAL DRAM CROSS POINT MEMORY CELL

RELATED APPLICATION

U.S. patent application Ser. No. 08/208,713, filed on Mar. 11, 1994 entitled "A Vertical Transistor with High Density DRAM Cell and Method of Making" by C. Y. Lu and H. H. Tseng.

BACKGROUND OF THE INVENTION (1) Field of the Invention

This invention relates to a method for making a high density DRAM cross point cell and the resulting structure, and particularly to those methods which produce a vertical field effect transistor and capacitor structure.

(2) Description of the Prior Art

As DRAMs are scaled down in dimensions, there is a continuous challenge to maintain a sufficiently high stored charge per capacitor unit area. In order to construct high density DRAMs in a reasonable sized chip area, the cell structures have to change from the conventional planar-type capacitors to either trench capacitors or stack capacitors, in particular beyond the 4 Mbit DRAM era. All efforts to increase capacitance without increasing the planar area of the capacitor can be categorized into building three dimensional capacitor structures to increase the capacitor area without increasing the planar area of the capacitor. There are two major branches of this approach, that is trench capacitors and stacked capacitors. In the category of trench capacitors, when the DRAM is beyond 16 Mbit, the trench needs to be very deep. There are technology and even theoretical physical limitations to processing the deep trenches that would be needed. When the stacked capacitor approach is used to fabricate 16 Mbit DRAMs and beyond, very complicated stacked structures are needed, such as fin structures, crown structures, and so forth.

The one transistor DRAM cell includes a field effect transistor and the capacitor in a three dimensioned structure as envisioned for future cells beyond the 16 Mbit device level. In "Advanced Cell Structures for Dynamic RAMS" by Nicky C. C. Lu, Published in IEEE Circuits and Device Magazine January 1989, pp. 27-36, Dr. Lu gives many types of three dimensional DRAM cell designs which have been known to the art. Particularly, on page 34, FIG. 15 there is shown various three dimensional cells. It is interesting to note that none of these DRAM cells are truly vertical, that is with the capacitor directly above the field effect device or alternatively the field effect device directly above the capacitor. W. F. Richardson et al in "A TRENCH TRANSISTOR CROSS-POINT DRAM CELL" Published in 1985 IEDM 85 pages 714–717 describes a vertical DRAM cell with the field effect device 4 directly above the capacitor 3 which is located within a trench as schematically shown in FIG. 1. There is no known reference to a vertical DRAM memory cell with a capacitor 3 located directly about a MOSFET device 4 as schematically shown in FIG. 2.

SUMMARY OF THE INVENTION

It is an object of the invention to provide a method for fabricating a one transistor and one capacitor DRAM cell which is truly three dimensional and vertical in the sense that the capacitor and field effect transistor is directly above one another.

It is a further object of the invention to provide a method for fabricating a three dimensional, truly vertical, one transistor DRAM cell which is useful for 16 Mbit device level and beyond.

It is a still further object of the invention to provide a one transistor DRAM cell which is truly three dimensional and vertical in the sense that the capacitor and field effect transistor is directly above one another.

In accordance with the objects of this invention, device structures are shown schematically in FIG. 2. The FIG. 2 memory cell is a truly vertical, three dimensional one field effect transistor and one capacitor with the field effect transistor 4 physically and electrically located directly below the capacitor 3. Preferably the vertical channel switch transistor might be in the trench and the capacitor in a stack.

Further in accordance with the invention there is shown a method for fabricating a vertical DRAM cell which includes a vertical channel field effect transistor having a gate electrode and source/drain elements and a capacitor. There is provided a pattern of field oxide isolation in a silicon substrate wherein there are a pattern of openings to the silicon substrate. A pattern is formed of buried bit lines and a pattern of lines of holes with a hole located within each of the openings to said silicon substrate which lines of holes and buried bit lines are perpendicular to one another and which the lines cross at the planned locations of the vertical DRAM cell at the pattern of openings to the silicon substrate. A gate dielectric is formed on the surfaces of the holes. A doped polysilicon layer is formed in and over the holes so that it covers the gate dielectric. The doped polysilicon layer is patterned and etched to form the gate electrode and word lines which are perpendicular to the pattern of buried bit lines. The source/drain elements are formed surrounding the gate electrode in the surface of the substrate by ion implantation using the field oxide and gate electrode and word lines as the mask. The buried bit lines form common and additional said source/drain elements. An insulating layer is provided over the pattern of field oxide insulation, word lines and openings to the source/drain elements surrounding the gate electrode. An opening is formed through the insulating layer surrounding the gate electrode. A capacitor is formed in and over the opening through the insulating layer.

The preferred device structure includes a vertical DRAM cell which includes a field effect transistor having a gate electrode and source/drain elements and a capacitor. A base substrate is provided. A pattern of buried bit lines in the base substrate, and an epitaxial silicon substrate is located over the base substrate. A pattern of field oxide isolation is located in the silicon substrate wherein there are a pattern of openings to the silicon substrate. A pattern of lines of holes with a hole located within each of the openings to the silicon substrate which lines of holes and the buried bit lines are perpendicular to one another and which the lines cross at the planned locations of the vertical DRAM cell at the pattern of openings to the silicon substrate. A gate dielectric is formed on the surfaces of the holes. A doped polysilicon layer is located in and over the holes so that it covers the gate dielectric. The doped polysilicon layer forms the gate electrode and word lines which are perpendicular to the pattern of buried bit lines. The source/drain elements surround the gate electrode in the surface of the substrate. The buried bit lines form common and additional source/drain elements. An insulating layer is located over the pattern of field oxide insulation, word lines and openings to the source/drain elements surrounding the gate electrode. An opening located through the insulating layer surrounds the gate electrode. A capacitor is located in and over the opening through the insulating layer.

BRIEF DESCRIPTION OF THE DRAWINGS

FIGS. 1 and 2 are schematic electrical and physical representations of the vertical one device DRAM cells. FIG. 1 is a Prior Art cell and FIG. 2 is the cell of the invention.

FIGS. 3A and 3B are schematic cross-sectional drawings taken along A:A' and B:B' cross-sections of FIG. 4.

DESCRIPTION OF THE PREFERRED EMBODIMENTS

Figure 4:
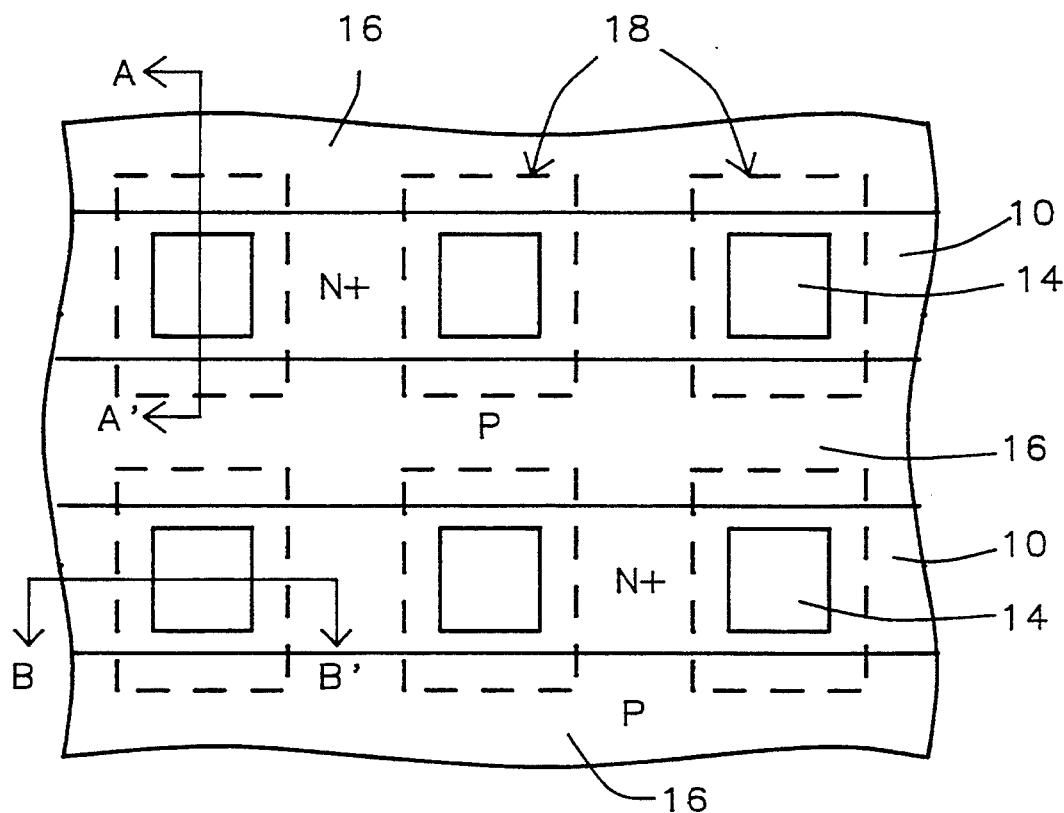
FIG. 4 is a elevational view at one point of the manufacture of the present invention.

Referring now to FIGS. 3A, 3B and 4, there is illustrated an intermediate truly vertical DRAM structure. The first series of steps involve the formation of the pattern of buried bit lines. There are two ways in which the pattern can be formed. The first way involves the use of an epitaxial grown layer and the second way uses masking and high energy ion implantation to form the buried bit lines.

The first method starts with a base substrate 8 of, for example P− monocrystalline silicon. Lithography and etching techniques are used to form the desired mask pattern for the planned parallel, pattern of buried bit lines 10. The buried bit lines 10 are then formed by diffusion or ion implantation steps. The bit lines in this embodiment are N+. The dopant for these N+ bit lines may be between about $1 \, E \, 14$ to $1 \, E \, 16$ atoms/cm$^2$ and the lines have a dopant concentration of between about $1 \, E \, 19$ to $1 \, E \, 21$ atoms/cm$^3$. The width of these lines are about 0.5 to 0.1 micrometers and junction depth between about 0.6 to 0.2 micrometers. The mask is removed. An epitaxial P-silicon substrate layer 12 is grown upon the base substrate 8. The thickness of this epitaxial layer 12 is chosen to be substantially identical to the desired depth of the planned holes 14. The thickness and hole depth is between about 0.8 to 0.1 micrometers.

The second method for forming the buried bit lines 10 seen in FIGS. 3A and 3B use the base substrate 8 with surface silicon substrate 12. Lithography and etching techniques are used to for the desired high energy ion implantation mask pattern for the planned parallel, pattern of buried bit lines 10. The buried bit lines 10 are then formed by high energy ion implantation steps using an energy of between about 2 MEV to 80 KEV and dopant concentration level of between about $2 \, E \, 14$ to $2 \, E \, 16$ atoms/cm$^2$. The base substrate 8 is shown as under the buried bit lines and the silicon substrate 12 is shown as above the buried bit lines, although the beginning substrate is one wafer. The bit lines in this embodiment are N+. The dopant for these N+ bit lines may be Arsenic, Antimony or Phosphorus and the lines have a dopant concentration level of between about $1 \, E \, 19$ to $1 \, E \, 21$ atoms/cm$^3$. The width of these lines are 0.5 to 0.1 micrometers and junction depth between about 1.4 to 0.3 micrometers. The mask is then removed.

The next series of steps involve the formation of the dielectric isolation regions for isolating semiconductor surface regions from other such regions in the silicon substrate layer 12. In an effort to simplify the description and the drawings the dielectric isolation between devices has been only partially shown and will not be described in detail, because they are conventional. For example, one method is uses shallow trench isolation (STI) such as that shown by B. Davari et al in IEDM-88 page 92 or P. C. Fazan et al in IEDM-93 page 57. Another method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 16. Then semiconductor devices can be provided in the pattern of openings 18 to the silicon substrate 12. The mask is then removed. The size of the openings 18 is critical for the vertical, one transistor DRAM cell of the present invention and are between about 1.0 to 0.3 micrometers.

The next steps involve the formation of the line of holes 14 which are preferably centrally located within the active area of silicon substrate 18. The hole pattern is formed in a mask using conventional lithography and etching techniques. The etching mask is usually a hard silicon oxide mask which was patterned by photoresist mask and then removing the organic photoresist level. The exposed silicon substrate 12 is anisotropically etched using Chlorine ($Cl_2$), fluorine ($F_2$), chlorinate or fluorinated (such as $CFCl_3$, $CCl_4$, $BCl_3+Cl_2$, $CF_4+O_2$, $SF_2$, $NF_3$, etc.) with the conditions of etching being low pressure of 13.3 pa, 50 sccm at 0.66 watts/cm$^2$ and for time of about 1 to 10 minutes to etch to a depth of between about 0.1 to 0.7 micrometers. The hole diameter is between about 0.1 to 0.7 micrometers.

The pattern of lines of holes 14 is perpendicular to the lines of buried bit lines 10. The holes 14 reach the bit lines 10 as can be seen from FIGS. 3A and 3B. This is a cross point. FIG. 3A is taken along the section of FIG. 4 indicated as A:A' and FIG. 3B is taken along the section of FIG. 4 as B:B'.

Figure 5A:
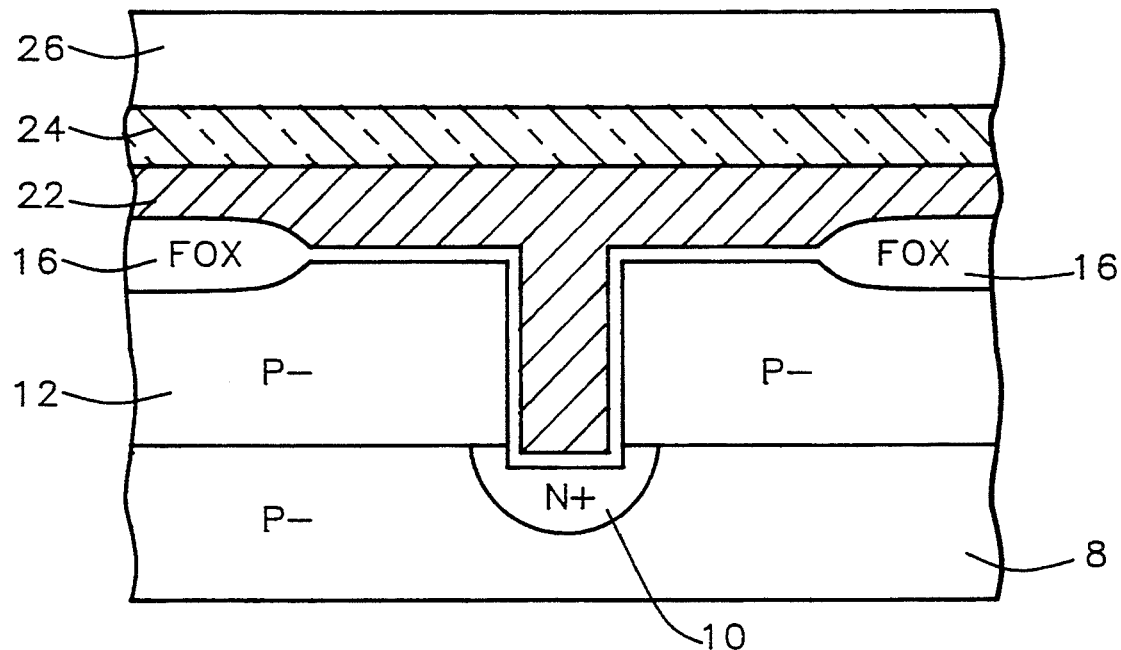
FIGS. 5A, 5B, 6A and 6B are schematic cross-sectional drawings showing the manufacturing process of the present invention.
Figure 5B:
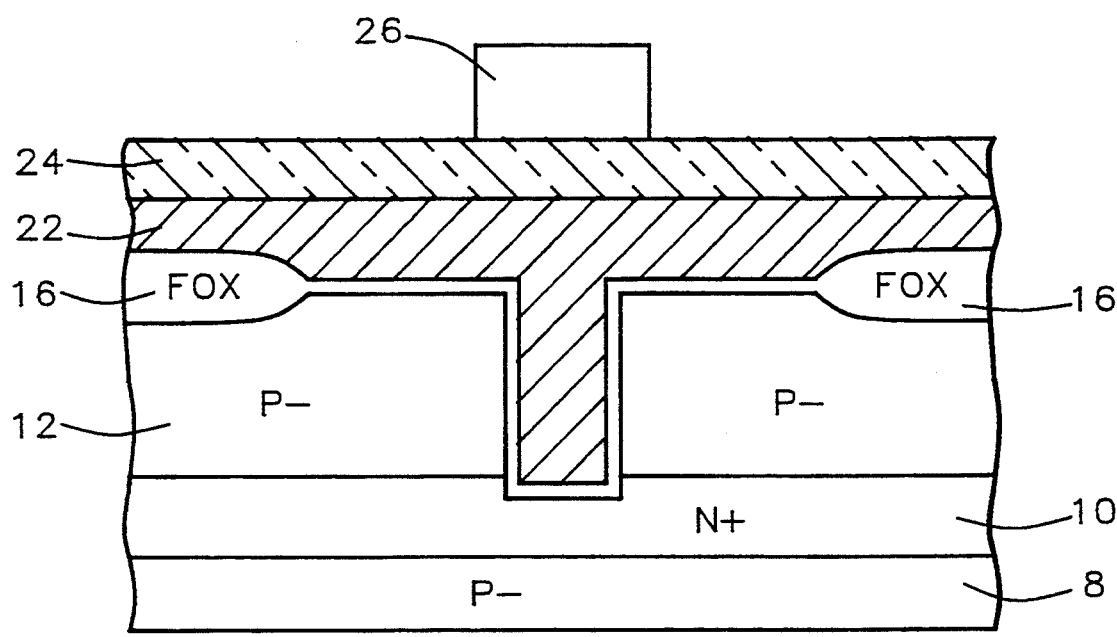

The exposed surfaces of the silicon substrate 12 is thermally oxidized to form the desired gate oxide 20 thickness. The preferred thickness is between about 30 to 150 Angstroms. Referring now to FIGS. 5A and 5B, the polysilicon layer 22 is blanket deposited by low pressure chemical vapor deposition (LPCVD) method. The preferred thickness of the polysilicon layer 22 is between about 500 to 2500 Angstroms. The polysilicon layer 22 is ion implanted with phosphorous or arsenic ions under the conditions $0.5 \, E \, 16$ to $2.5 \, E \, 16$ dosage atoms per cm$^2$ and 20 to 60 Kev, or doped with phosphorus oxychloride at a temperature about 900° C. Alternatively, the polysilicon layer may be doped in situ.

Figure 7:
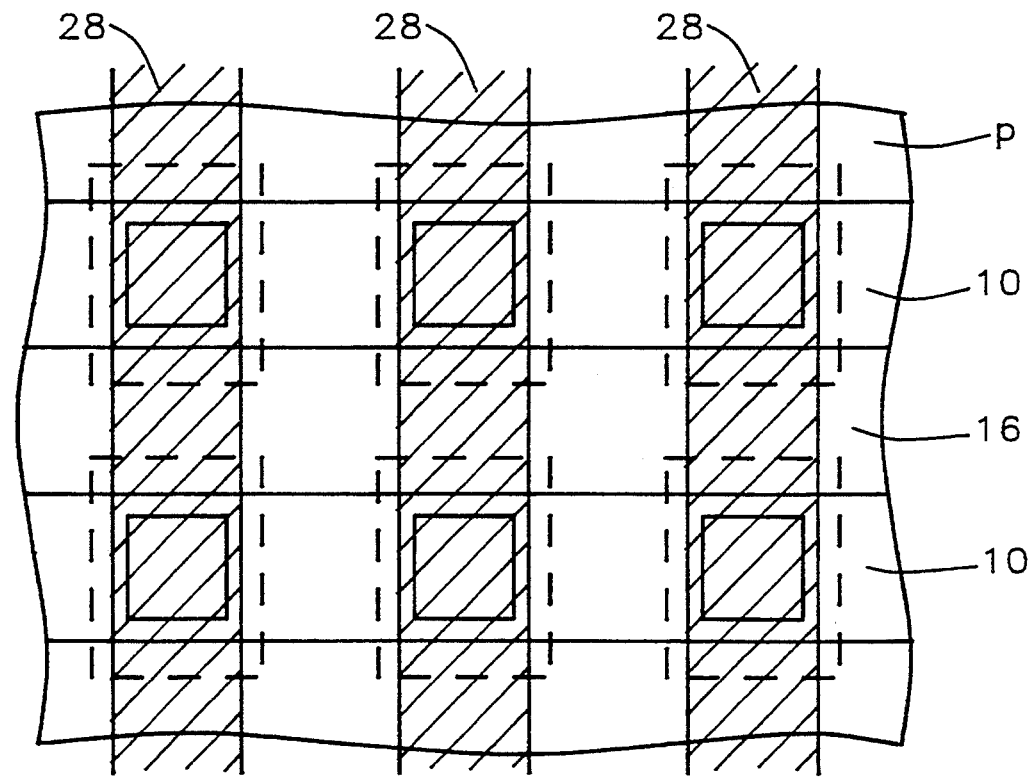
FIG. 7 is an elevational view of the intermediate structure after the polysilicon word lines have been formed in the process of the invention.

An insulating or dielectric layer 24, such as silicon oxide or silicon nitride is formed over the polysilicon layer 22 by the LPCVD method as described in "VLSI TECHNOLOGY" by S. M. SZE 2ND. ED. published by McGraw-Hill New York, N.Y. 1988. A photoresist mask 26 is formed on the layer 24 by standard lithography and etching techniques to the desired gate electrode within the holes 14 and the word line pattern 28. The layers 24 and 22 are anisotropically etched to provide a desired pattern of gate electrodes and word line pattern 28 on the FOX 16 surfaces and silicon substrate surfaces as seen in FIGS. 6A, 6B and elevational FIG. 7.

The source/drain structure of the vertical, one MOS FET DRAM cell may now be formed by the following steps. The FIG. 6A and 6B illustrates the formation of an N vertical channel FET integrated circuit device. However, it is well understood by those skilled in the art that a P vertical channel FET integrated circuit device could also be formed by simply substituting opposite polarities to those given for the N channel embodiment. Also, a CMOS FET could in a similar way be formed by making both N channel and P channel devices upon the same substrate.

Figure 6A:
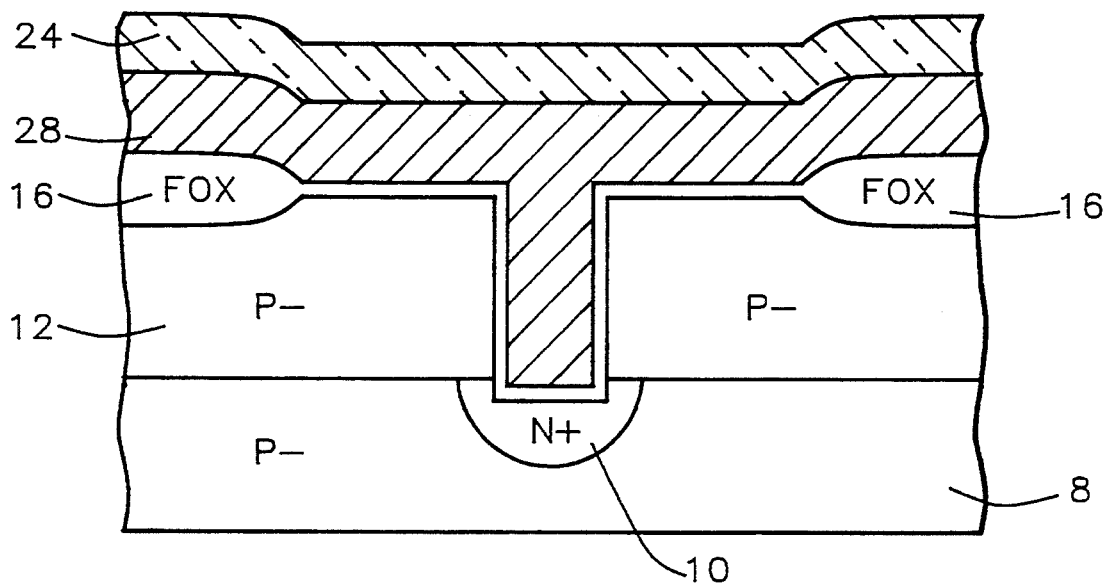
Figure 6B:
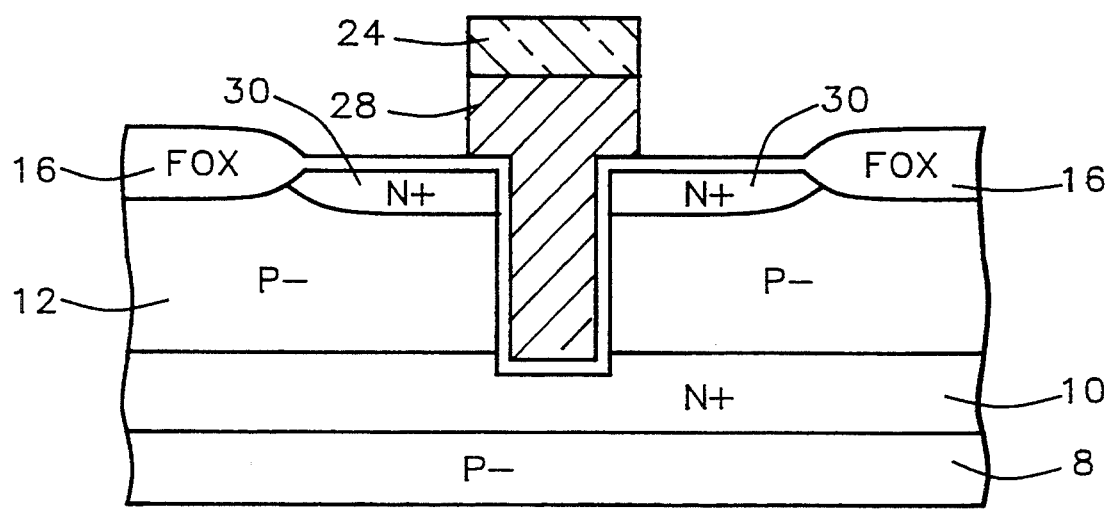

FIG. 6A and 6B shows the ion implantation of N+ dopants to form source/drain regions surrounding the gate electrode 28 in the surface of the silicon substrate opening 18 using the field oxide 16 and gate electrode and word lines 28 as the mask. The N+ source/drain ion implantation uses Arsenic, As75 or phosphorus P31 with a dose of between about 1 E 15 to 2 E 16 atoms/cm.$^2$ and energy of between about 20 to 70 Kev. to complete the source/drain regions 30 of the N channel MOS FET integrated circuits device as seen in the FIGS. 6A and 6B. This step establishes the field effect transistor with the gate electrode 28 within the hole, one source/drain element 30 surrounding the gate electrode at the surface, the other source/drain element is the buried bit line 10, and the channel is between these two source/drain elements surrounding the hole. It can be seen that this MOS FET structure in the vertical dimension allows greater channel length and width in turn overcomes the many problems of the prior art short channel devices.

The dielectric spacer 32 is now to be formed. A low temperature silicon oxide deposition is preferred such as through the chemical vapor deposition of tetraethoxysilane (TEOS) at a temperature in the range of between about 500° to 700° C. Other silicon oxide deposition methods include silane based LPCVD. The thickness of the dielectric silicon dioxide layer 32 is between about 300 to 1500 Angstroms and preferably about 600 Angstroms.

Figure 8A:
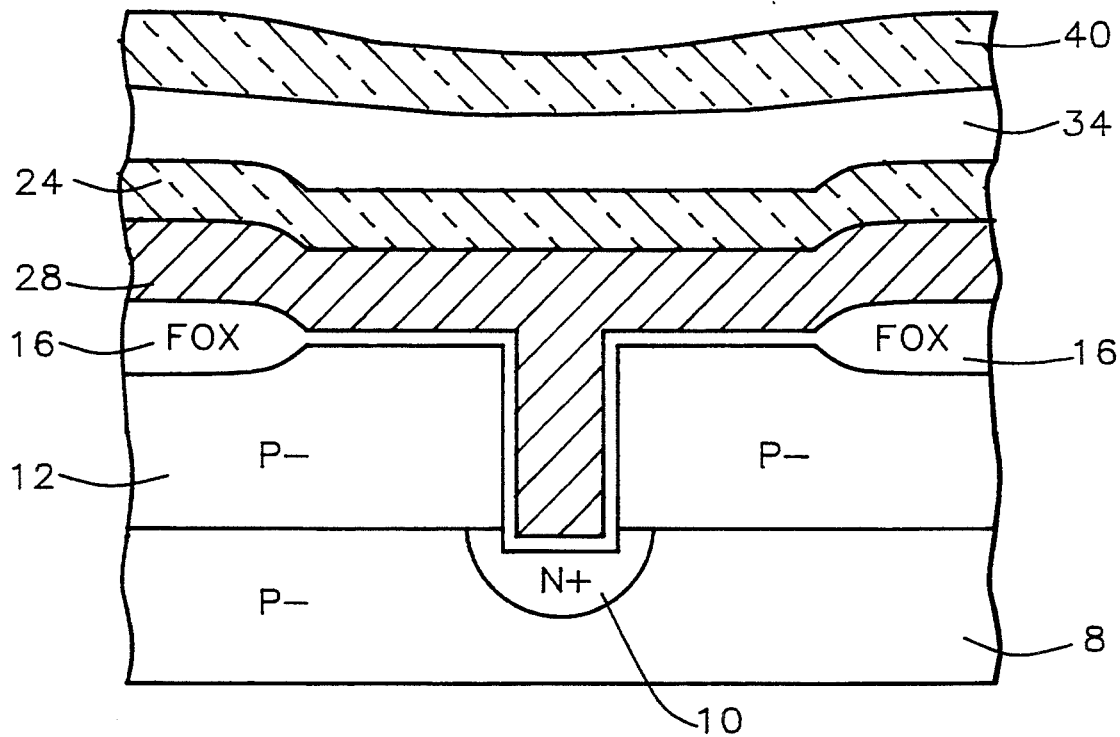
FIGS. 8A, 8B, 9A and 9B are schematic cross-sectional drawings showing the manufacturing process of the present invention.
Figure 8B:
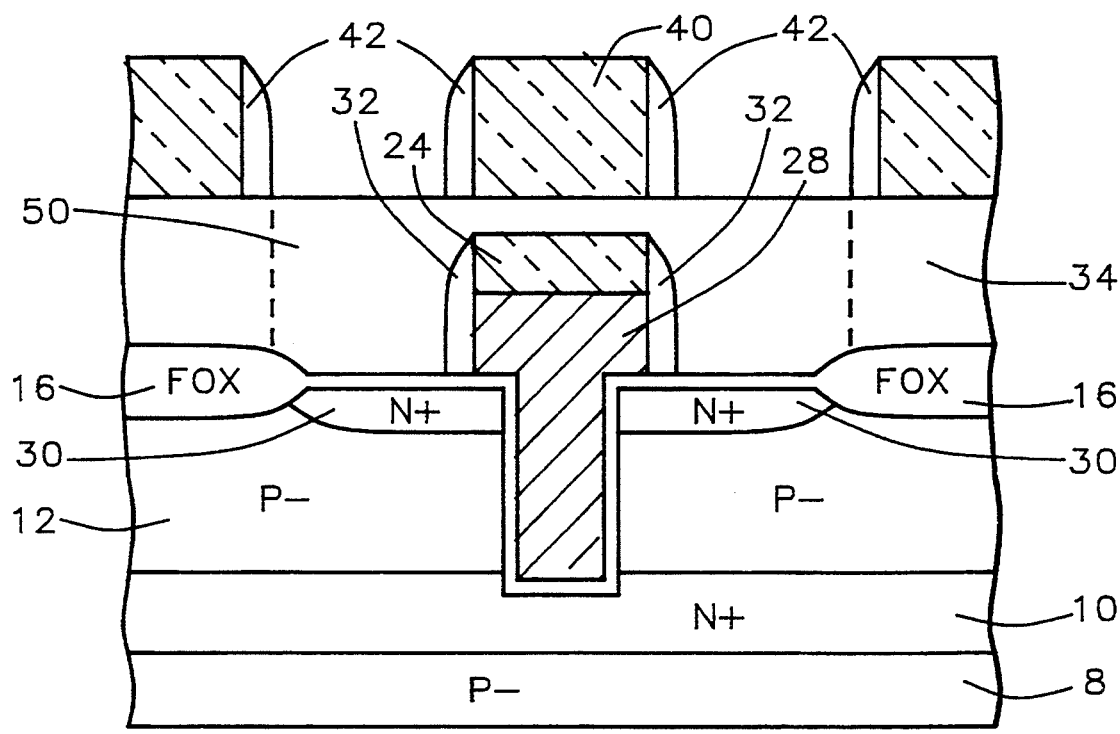

An anisotropic etching of this layer produces the dielectric spacer layer 32 on the sidewalls of the layer structures 28, 24 as seen in FIGS. 8A and 8B. The preferred anisotropic etching uses a conventional reactive ion etching ambient.

A dielectric insulating layer 34 is formed over the exposed top surfaces, that is FOX 16, gate dielectric layer 20, gate electrode word lines 28 with insulator layer 24 and spacer 32 thereover, of the structure. This layer 34 may be composed of a combination of silicon oxide and a glasseous layer, such as phosphosilicate or borophosphosilicate glass. The glass layer may be reflowed to provide planarization of the upper surfaces thereof. The total thickness of this layer 34 is between about 1000 to 5000 Angstroms. Third dielectric layer 34 can be planarized by either glass flow at about 800° to 900° C. in nitrogen, argon or oxygen ambient and/or resist planarization etching back process. In addition, a chemical mechanical polish (CMP) can also be used to planarize this layer.

Figure 9A:
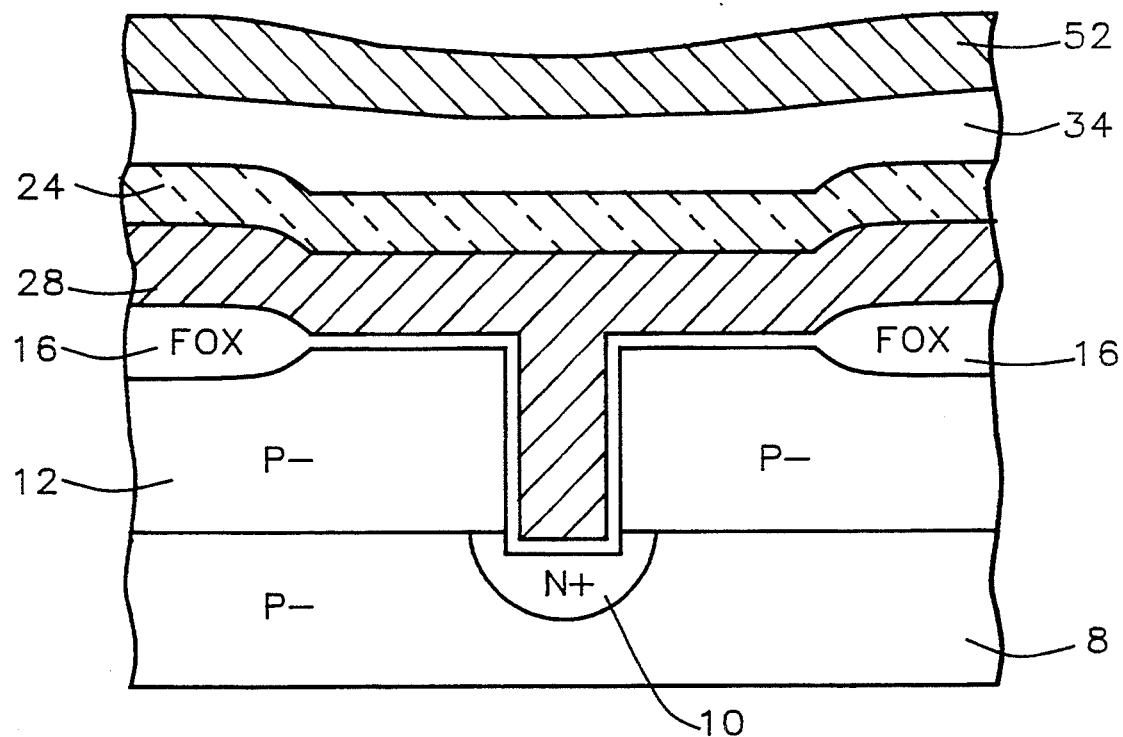
Figure 9B:
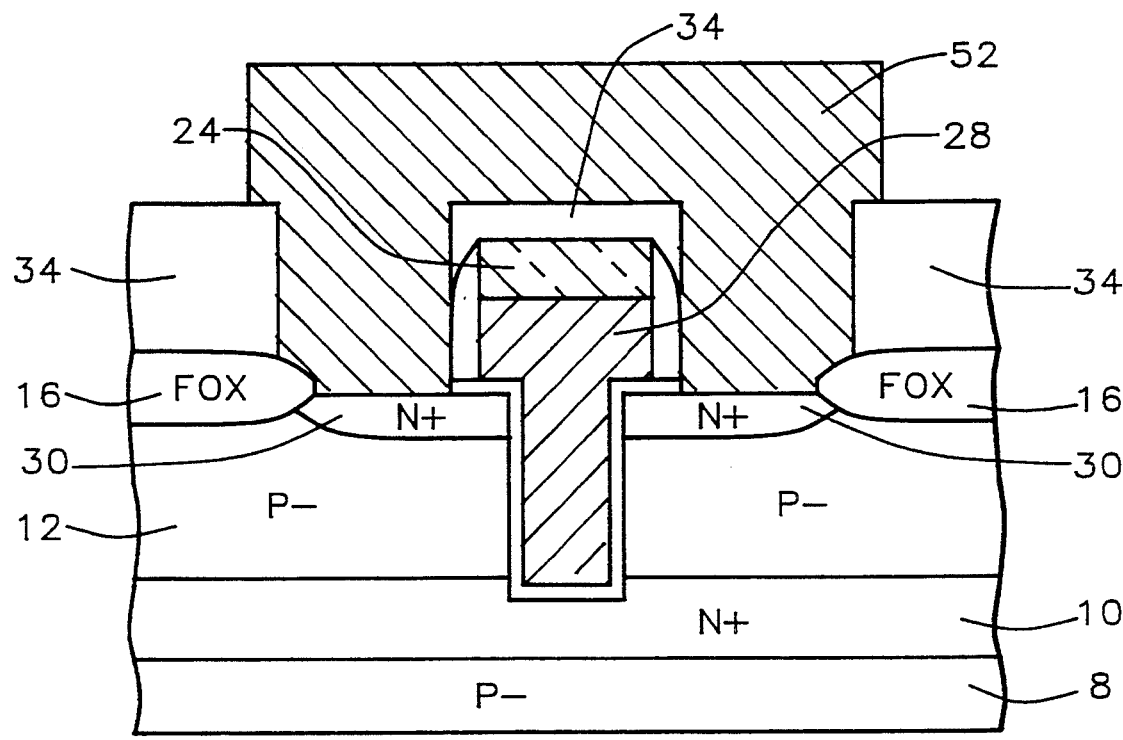

Openings through the dielectric insulating layer 34 must now be made to contact the source/drain regions 30. This is preferably done using a mask 40 of polysilicon or silicon nitride. Lithography and etching is used to form this mask 40. Where needed the narrowing of these mask 40 openings can be accomplished by use of spacers 42. The spacers 42 are formed by the uniform deposition of a layer 42, followed by an anisotropic etching step to form the spacers 42. The spacers may be composed of polysilicon or silicon nitride. Using the mask 40, 42 openings 50 are etched to the layer 20 covering the source/drain regions 30. The masks 40 and 42 are removed. A light etch dip using a water diluted HF solution removes the thin silicon oxide layer 20 over the source/drain regions 30 as seen in FIG. 9B.

Figure 10:
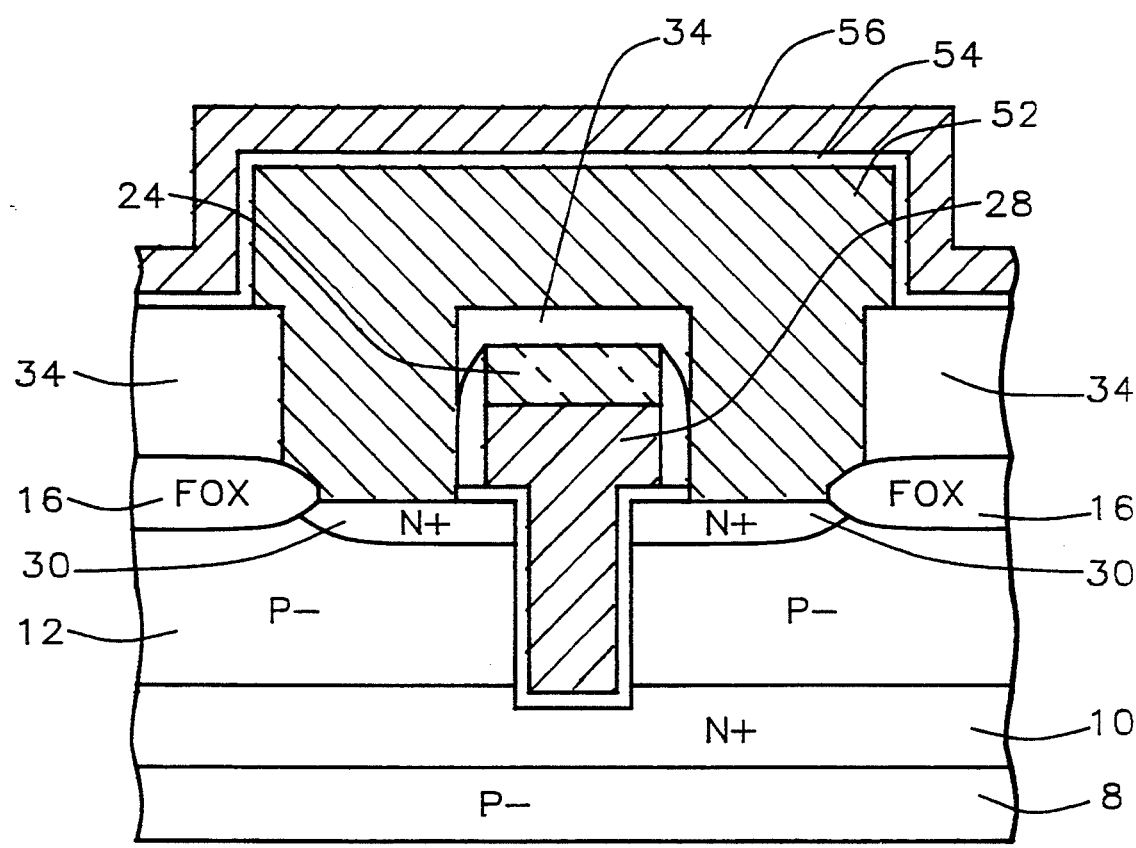
FIGS. 10 through 13 show various embodiments of the completed vertical channel memory cell the capacitor device directly above the MOSFET device.
Figure 11:
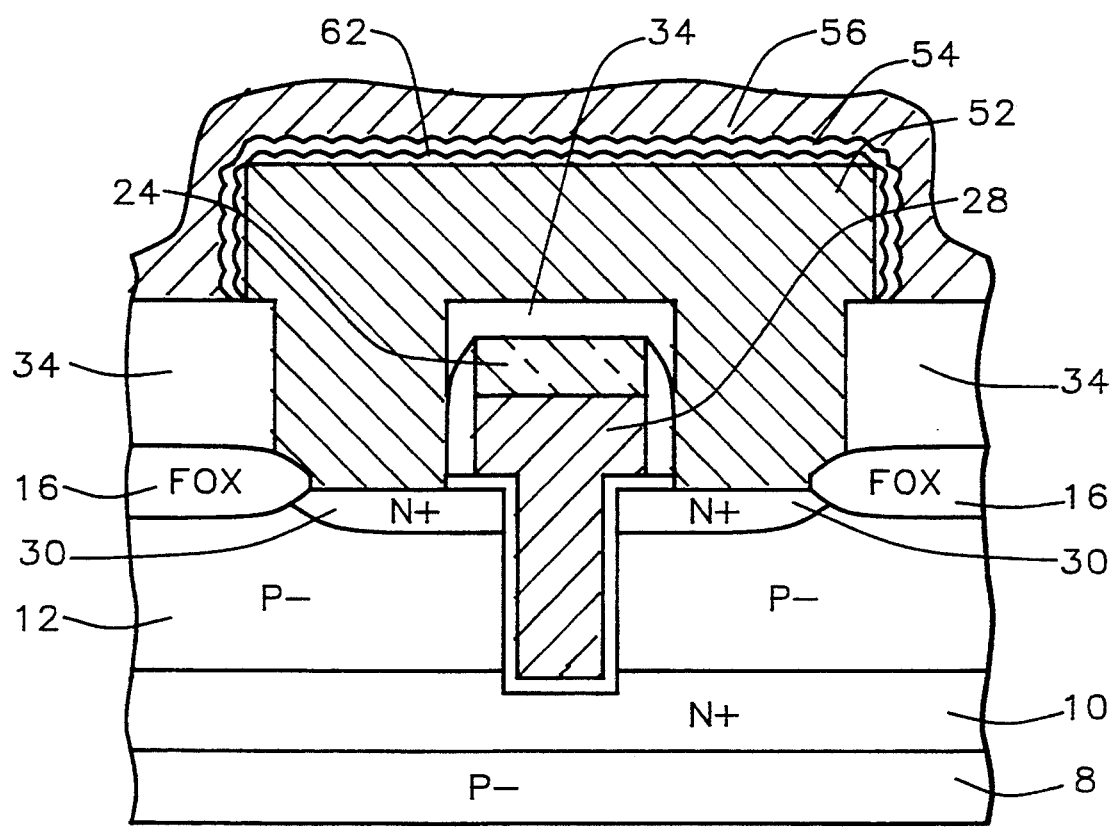
Figure 12:
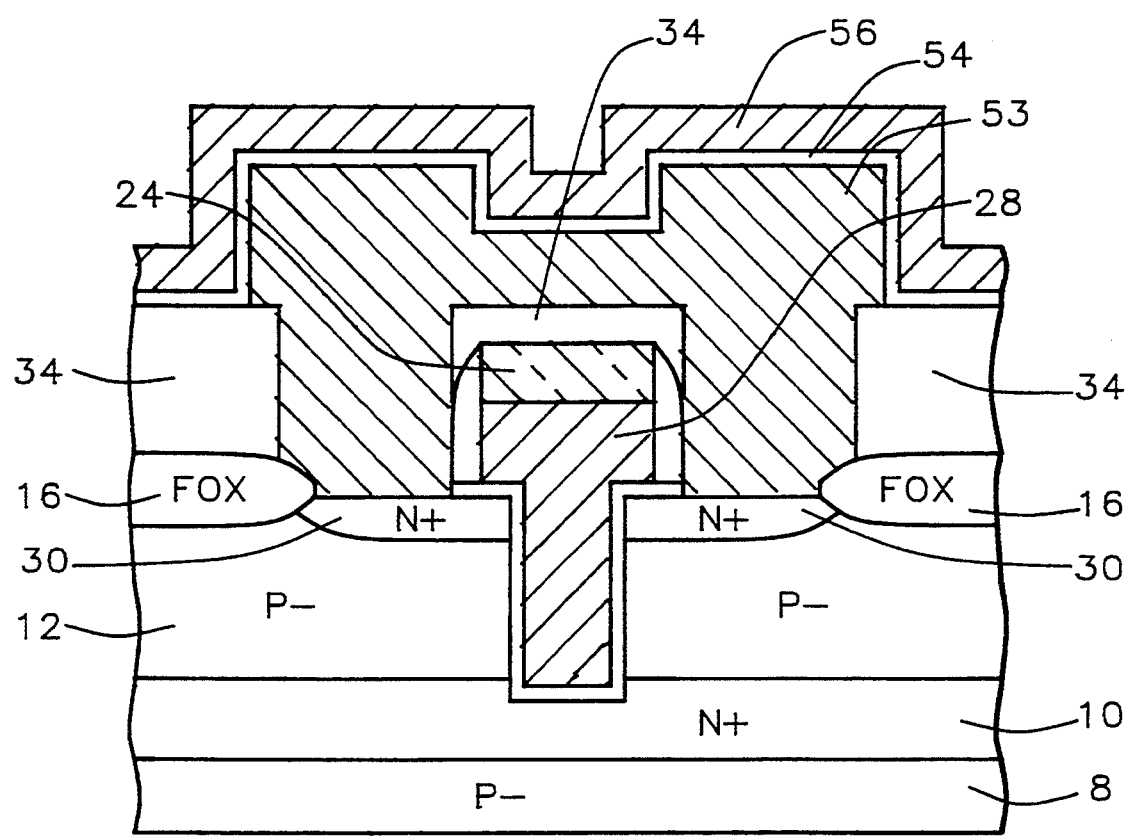

The next series of steps form the capacitor over the MOS FET device of the one transistor, vertical DRAM cell as can be seen with reference to FIGS. 9A, 9B, 10, 11, 12 and 13. A second polysilicon layer 52 is deposited to fill the openings 50 and to cover the surfaces of layer 34. The layer 52 may be between about 2000 to 6000 Angstroms thick and be deposited by LPCVD on the top of glass layer 34 and to contact the source/drain region 30. The layer 52 will serve as the node plate of the capacitor. This lager 52 is doped by either ion implantation with Arsenic or phosphorus using a dose of 1 E 15 to 20 E 15 atoms/cm$^2$ at an energy of about 10 to 40 KEV. Alternatively, the layer 52 can be doped by phosphorus oxychloride diffusion. Further, as an alternative the layer 52 can be in situ doped. The layer 52 is patterned and etched by conventional lithography to form the plate 52 or 53 of the capacitor as seen in FIG. 10 or FIG. 12, respectively.

FIG. 10 structure is the so-called conventional simple stack capacitor. FIG. 12 is the cylindrical electrode stack capacitor. The cylindrical shape polysilicon layer 53 electrode can be formed by additional mask and etching, or by the method suggested by "A NEW CYLINDRICAL CAPACITOR USING HEMISPHERICAL GRAINED SI (HSG-SI) FOR 256 Mb DRAMs) by H. Watanabe et al published in IEDM-92 pages 259-262.

After the patterning a the layer 52, a thin layer of dielectric 54 is deposited. The preferred effective (based upon effective silicon oxide material) thickness of the capacitor dielectric layer is between about 20 to 50 Angstroms. The dielectric material may be composed of silicon oxide-silicon nitride-silicon oxide (ONO) composite, silicon oxide-silicon nitride (ON) composite, or high dielectric materials such as tantalum oxide ($Ta_2O_5$ or the like), $Ba_xSr_yTiO_3$, or ferroelectric films. The ONO or ON are deposited as is known in the art. The high dielectric materials may be deposited as suggested by S. Kamiyama et al in IEDM 1993 paper 3.4, K. W. Kwon et al in IEDM 1993 paper 3.5, and E. Fujii et al in IEDM 1992 page 267.

A third polysilicon layer 56 is deposited by LPCVD at between about 500° to 750° C. of a thickness of about 500 to 2500 Angstroms. This layer 56 will serve as the ground plate of the capacitor electrode. The layer 56 is doped in situ, by ion implantation or by phosphorus oxychloride diffusion. This completes the capacitor of FIGS. 10 and 12.

Figure 13:
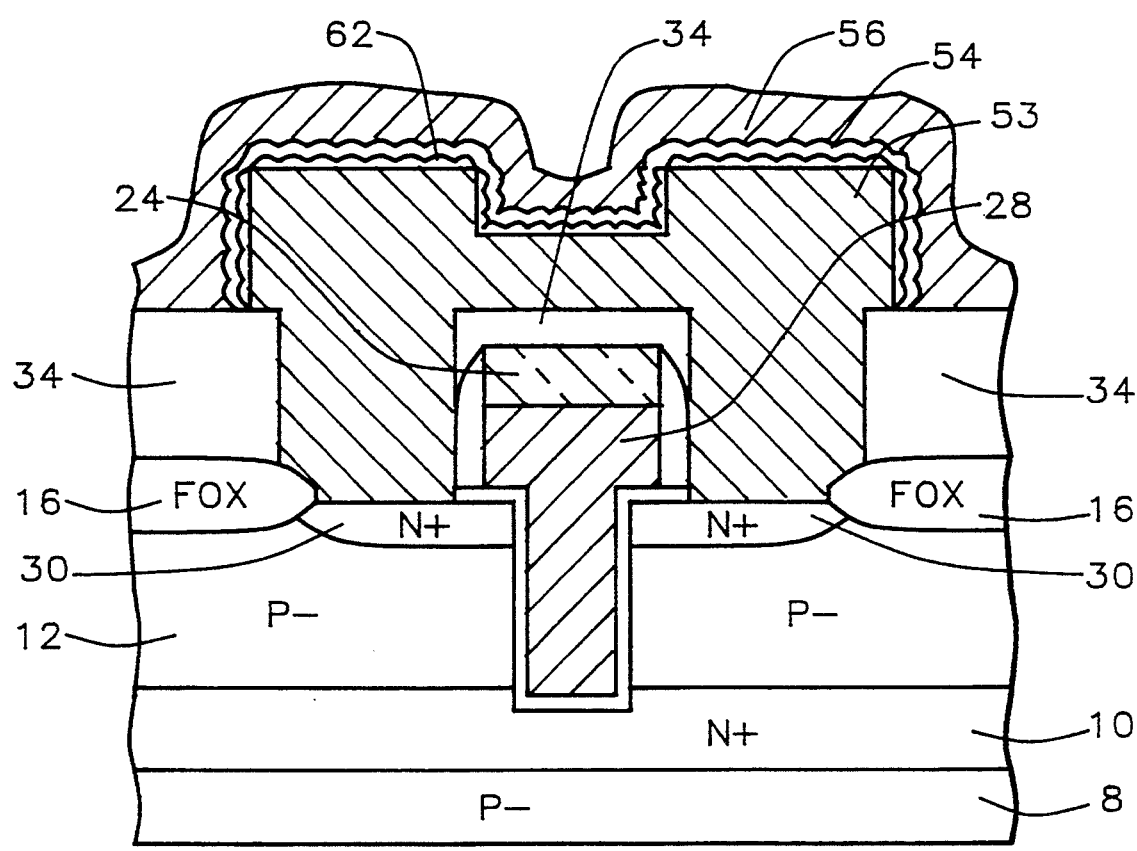

Referring now more particularly to FIGS. 11 and 13, it is possible to increase the capacitance of either the simple or cylindrical stacked capacitor of FIGS. 10 and 12. This is done by making the surface of the polysilicon layer 52 rippled to increase effective surface area without increasing the planar area. The method of rippling the layer 52 can be done using the methods of C. Y. Lu U.S. Pat. No. 5,213,992 or "HEMISPHERICAL GRAIN SILICON (HSG) for HIGH DENSITY DRAMs⇌ by H. Watanabe et al in Solid State Technology, page 29, July 1992. The rippled polysilicon surface of layer 52 is indicated at 60 in FIG. 11. The rippled polysilicon surface of layer 53 is indicated at 62 in FIG. 13.

While the invention has been particularly shown and described with reference to the preferred embodiments thereof, it will be understood by those skilled in the art that various changes in form and details may be made without departing from the spirit and scope of the invention.

What is claimed is:

1. The method for fabricating a vertical DRAM cell which includes a field effect transistor having a Sate electrode and source/drain elements and a capacitor comprising:

providing a pattern of field oxide isolation in a silicon substrate wherein there are a pattern of openings to the silicon substrate, and a pattern of buried bit lines and a pattern of lines of holes with a hole located within each of said openings to said silicon substrate which lines of holes and buried bit lines are perpendicular to one another and which said lines cross at the planned locations of said vertical DRAM cell at said pattern of openings to the silicon substrate;

forming a gate dielectric on the surfaces of said holes;

forming a doped polysilicon layer in and over said holes so that it covers said gate dielectric;

etching said doped polysilicon layer to form said Sate electrode and word lines which are perpendicular to said pattern of buried bit lines;

forming said source/drain elements surrounding said Sate electrode in the surface of said substrate by ion implantation using the field oxide and gate electrode and word lines as the mask;

wherein said buried bit lines form common and additional said source/drain elements;

providing an insulating layer over said pattern of field oxide insulation, said word lines and openings to said source/drain elements surrounding said gate electrode;

forming an opening through said insulating layer surrounding said gate electrode; and forming a capacitor in and over said opening through said insulating layer.

2. The method of claim 1 wherein said silicon substrate comprises a base substrate and an epitaxial silicon layer formed over said base substrate, and said pattern of buried bit lines are formed in said base substrate.

3. The method of claim 2 wherein said base substrate is composed of monocrystalline silicon.

4. The method of claim 1 wherein said pattern of buried bit lines are formed below the surface of said silicon substrate by high energy ion implantation through a mask.

5. The method of claim 4 wherein said high energy ion implantation uses a energy of between about 80 KEV to MEV and a dopant concentration of about 2 E 14 to 2 E 16 atoms/cm$^2$.

6. The method of claim 1 wherein the dopant concentration level of said buried bit lines is between about 1 E 19 to 1 E 21 atoms/cm$^3$.

7. The method of claim 1 wherein the size of said pattern of openings to said silicon substrate is between about 0.3 to 1.0 micrometers.

8. The method of claim 1 wherein said hole located within each of said openings to said silicon substrate is centrally located therein, the hole reaches to said buried bit lines, and has a diameter of between about 0.1 to 0.7 micrometers.

9. The method of claim 8 wherein said depth of said hole is between about 0.1 to 0.7 micrometers.

10. The method of claim 1 wherein said source/drain elements surrounding said gate electrode in the surface of said substrate and said buried bit lines common and source/drain elements cooperate with said gate electrode to form said field effect transistor of said vertical DRAM cell.

11. The method of claim 10 wherein said capacitor is connected to said field effect transistor to form said vertical DRAM cell.

12. The method of claim 1 wherein said capacitor is formed by depositing a polysilicon node plate layer over and into said opening and in electrical contact with said source/drain elements, forming a capacitor dielectric layer thereover and forming a polysilicon ground plate layer over said dielectric layer.

13. The method of claim 12 wherein said capacitor wherein said polysilicon node plate layer is formed with a rippled pattern so as to increase the effective surface area of said node plate layer.

14. The method for fabricating a vertical DRAM cell which includes a field effect transistor having a gate electrode and source/drain elements and a capacitor comprising:

providing a base substrate;

forming a pattern of buried bit lines in said base substrate, and forming a silicon substrate over said base substrate by epitaxial growth;

forming a pattern of field oxide isolation in said silicon substrate wherein there are a pattern of openings to the silicon substrate;

forming a pattern of lines of holes with a hole located within each of said openings to said silicon substrate which lines of holes and said buried bit lines are perpendicular to one another and which said lines cross at the planned locations of said vertical DRAM cell at said pattern of openings to the silicon substrate;

forming a gate dielectric on the surfaces of said holes;

forming a doped polysilicon layer in and over said holes so that it covers said gate dielectric:

etching said doped polysilicon layer to form said gate electrode and word lines which are perpendicular to said pattern of buried bit lines;

forming said source/drain elements surrounding said gate electrode in the surface of said substrate by ion implantation using the field oxide and gate electrode and word lines as the mask;

wherein said buried bit lines form common and additional said source/drain elements;

providing an insulating layer over said pattern of field oxide insulation, said word lines and openings to said source/drain elements surrounding said gate electrode;

forming an opening through said insulating layer surrounding said gate electrode; and forming a capacitor in and over said opening through said insulating layer.

15. The method of claim 14 wherein the thickness of said epitaxial layer is between about 0.1 to 0.8 micrometers.

16. The method of claim 14 wherein the dopant concentration level of said buried bit lines is between about 1 E 19 to 1 E 21 atoms/cm$^3$.

17. The method of claim 14 wherein the size of said pattern of openings to said silicon substrate is between about 0.3 to 1.0 micrometers.

18. The method of claim 14 wherein said hole located within each of said openings to said silicon substrate is centrally located therein, the hole reaches to said buried bit lines, and has a diameter of between about 0.1 to 0.7 micrometers.

19. The method of claim 18 wherein said depth of said hole is between about 0.1 to 0.7 micrometers.

20. The method of claim 14 wherein said source/drain elements surrounding said gate electrode in the surface of said substrate and said buried bit lines common and source/drain elements cooperate with said gate electrode to form said field effect transistor of said vertical DRAM cell.

21. The method of claim 20 wherein said capacitor is connected to said field effect transistor to form said vertical DRAM cell.

22. The method of claim 14 wherein said capacitor is formed by depositing a polysilicon node plate layer over and into said opening and in electrical contact with said source/drain elements, forming a capacitor dielectric layer thereover and forming a polysilicon ground plate layer over said dielectric layer.

23. The method of claim 22 wherein said capacitor wherein said polysilicon node plate layer is formed with a rippled pattern so as to increase the effective surface area of said node plate layer.

* * * * *